(12) United States Patent
Hsieh et al.

(10) Patent No.: US 10,901,001 B2
(45) Date of Patent: Jan. 26, 2021

(54) PROBE CARD DEVICE AND PROBE HEAD

(71) Applicant: CHUNGHWA PRECISION TEST TECH. CO., LTD., Taoyuan (TW)

(72) Inventors: Chih-Peng Hsieh, Taipei (TW); Wei-Jhih Su, Taichung (TW)

(73) Assignee: CHUNGHWA PRECISION TEST TECH. CO., LTD., Taoyuan (TW)

(*) Notice: Subject to any disclaimer, the term of this patent is extended or adjusted under 35 U.S.C. 154(b) by 160 days.

(21) Appl. No.: 16/359,472

(22) Filed: Mar. 20, 2019

(65) Prior Publication Data
US 2019/0302147 A1 Oct. 3, 2019

(30) Foreign Application Priority Data

Apr. 3, 2018 (TW) .............................. 107111888 A

(51) Int. Cl.
G01R 1/073 (2006.01)
(52) U.S. Cl.
CPC ................................ G01R 1/07371 (2013.01)
(58) Field of Classification Search
CPC .................................................. G01R 1/07371
USPC .................................................... 324/754.07
See application file for complete search history.

(56) References Cited

U.S. PATENT DOCUMENTS

| | | | | |
|---|---|---|---|---|
| 5,585,675 A | * | 12/1996 | Knopf ................... | H01L 23/481 257/686 |
| 5,942,906 A | * | 8/1999 | Stowers ............. | H01R 13/2421 324/750.25 |
| 5,977,787 A | * | 11/1999 | Das ..................... | G01R 1/07371 324/755.06 |
| 2009/0026050 A1 | * | 1/2009 | Tominaga .......... | G01R 1/07371 200/1 A |
| 2009/0072849 A1 | * | 3/2009 | Dickson ............. | G01R 1/07371 324/763.01 |
| 2016/0223586 A1 | * | 8/2016 | Lin ..................... | G01R 1/07357 |
| 2017/0242057 A1 | * | 8/2017 | Mori .................. | G01R 1/07342 |
| 2018/0059140 A1 | * | 3/2018 | Li ........................ | G01R 1/0416 |
| 2018/0088150 A1 | * | 3/2018 | Kuga ................. | G01R 1/07314 |
| 2019/0302147 A1 | * | 10/2019 | Hsieh ................. | G01R 1/07371 |
| 2019/0302148 A1 | * | 10/2019 | Maggioni .......... | G01R 1/07357 |
| 2019/0377006 A1 | * | 12/2019 | Crippa ................. | G01R 1/0483 |
| 2020/0200795 A1 | * | 6/2020 | Crippa .................. | G01R 1/025 |

* cited by examiner

Primary Examiner — Christopher P McAndrew
(74) Attorney, Agent, or Firm — Li & Cai Intellectual Property (USA) Office

(57) ABSTRACT

A probe head includes a first die, a second die, and a plurality of rectangular probes. Each rectangular probe includes a deformable segment arranged between the first and the second dies, a first positioned segment, and a second positioned segment, the latter two of which respectively extend from two opposite ends of the deformable segment and are respectively arranged in a first rectangular wall of the first die and a second rectangular wall of the second die. Each first rectangular wall and the corresponding second rectangular wall have a longitudinal offset and a width offset so as to press the first and second positioned segments of the corresponding rectangular probe, so that the deformable segment of the corresponding rectangular probe is compressed to be in a curved and deformed shape. A ratio of the longitudinal offset to the width offset is within a range of 10 to 1.

6 Claims, 6 Drawing Sheets

PROBE CARD DEVICE AND PROBE HEAD

CROSS-REFERENCE TO RELATED PATENT APPLICATION

This application claims the benefit of priority to Taiwan Patent Application No. 107111888, filed on Apr. 3, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

BACKGROUND OF THE DISCLOSURE

Field of the Disclosure

The present disclosure relates to a probe card; in particular, to a probe card device and a probe head.

Description of Related Art

In a testing process of semi-conductor wafer, a testing apparatus is electrically connected to an object to be tested by using a probe card device. The testing apparatus can obtain a testing result of the object to be tested by signal transmission and signal analysis. The conventional probe card device has a plurality of probes corresponding in position to electrical pads of the object, and the probes are used to simultaneously and respectively contact the electrical pads of the object.

Specifically, the probes of the conventional probe card device can be rectangular probes, which are made by using a microelectromechanical systems (MEMS) technology to be formed in a shape based on design requirements. However, if a part of the rectangular probe is deformed due to compression in a longitudinal direction and in a width direction, the compressed part of the rectangular probe may easily fracture under stress concentration.

SUMMARY OF THE DISCLOSURE

The present disclosure provides a probe card device and a probe head to solve the issues associated with conventional probe card devices.

The present disclosure provides a probe card device, which includes a probe head and a transfer plate. The probe head defines a longitudinal direction, a width direction, and a height direction. The longitudinal direction, the width direction, and the height direction are perpendicular to each other. The probe head also includes a first die, a second die, and a plurality of rectangular probes. The first die has a plurality of first rectangular walls each defining a thru-hole. A long surface of each of the first rectangular walls is parallel to the longitudinal direction, and a short surface of each of the first rectangular walls is parallel to the width direction. The second die is spaced apart from the first die along the height direction and has a plurality of second rectangular walls each defining a thru-hole. The second rectangular walls are arranged to respectively correspond in position to the first rectangular walls. Each of the rectangular probes has a deformable segment, a first positioned segment and a second positioned segment respectively extending from two opposite ends of the deformable segment, a first contacting segment extending from the first positioned segment along a direction away from the deformable segment, and a second contacting segment extending from the second positioned segment along a direction away from the deformable segment. Any portion of each of the deformable segments has the same cross sectional area. The deformable segments are substantially arranged between the first die and the second die, the first positioned segments are respectively disposed in the first rectangular walls of the first die, the second positioned segments are respectively disposed in the second rectangular walls of the second die, the first contacting segments are respectively arranged outside the first rectangular walls, and the second contacting segments are respectively arranged outside the second rectangular walls. Each of the first rectangular walls and the corresponding second rectangular wall have a longitudinal offset in the longitudinal direction and a width offset in the width direction so as to press the first positioned segment and the second positioned segment of the corresponding rectangular probe, so that the deformable segment of the corresponding rectangular probe is compressed to be in a curved and deformed shape. A ratio of the longitudinal offset to the width offset is within a range of 10 to 1. The transfer plate is abutted against and fixed to the first contacting segments of the rectangular probes, wherein the second contacting segments of the rectangular probes are configured to elastically and detachably abut against an object to be tested.

The present disclosure also provides a probe head defining a longitudinal direction, a width direction, and a height direction, which are perpendicular to each other. The probe head includes a first die, a second die, and a plurality of rectangular probes. The first die has a plurality of first rectangular walls each defining a thru-hole. A long surface of each of the first rectangular walls is parallel to the longitudinal direction, and a short surface of each of the first rectangular walls is parallel to the width direction. The second die is spaced apart from the first die along the height direction and has a plurality of second rectangular walls each defining a thru-hole. The second rectangular walls respectively correspond in position to the first rectangular walls. Each of the rectangular probes has a deformable segment, a first positioned segment, and a second positioned segment. The first positioned segment and the second positioned respectively extend from two opposite ends of the deformable segment. Any portion of each of the deformable segments has the same cross sectional area. The deformable segments are substantially arranged between the first die and the second die, the first positioned segments are respectively disposed in the first rectangular walls of the first die, and the second positioned segments are respectively disposed in the second rectangular walls of the second die. Each of the first rectangular walls and the corresponding second rectangular wall have a longitudinal offset in the longitudinal direction and a width offset in the width direction so as to press the first positioned segment and the second positioned segment of the corresponding rectangular probe, so that the deformable segment of the corresponding rectangular probe is compressed to be in a curved and deformed shape. A ratio of the longitudinal offset to the width offset is within a range of 10 to 1.

In summary, by adjusting the longitudinal offset and the width offset, the probe head (or the probe card device) of the present disclosure enables the deformable segment of each of the rectangular probes to be in a proper deformed range to prevent fracture, such that the reliability and service life of the probe head (or the probe card device) can be effectively improved. Moreover, when the second contacting segments of the probe head (or the probe card device) are used to contact an object by a pressure, the deformable segment subjected to the pressure will not be easily fractured by adjusting the longitudinal offset and the width offset.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE EXEMPLARY EMBODIMENTS

References are hereunder made to the detailed descriptions and appended drawings in connection with the present disclosure. However, the appended drawings are merely provided for exemplary purposes, and should not be construed as restricting the scope of the present disclosure.

Figure 1:
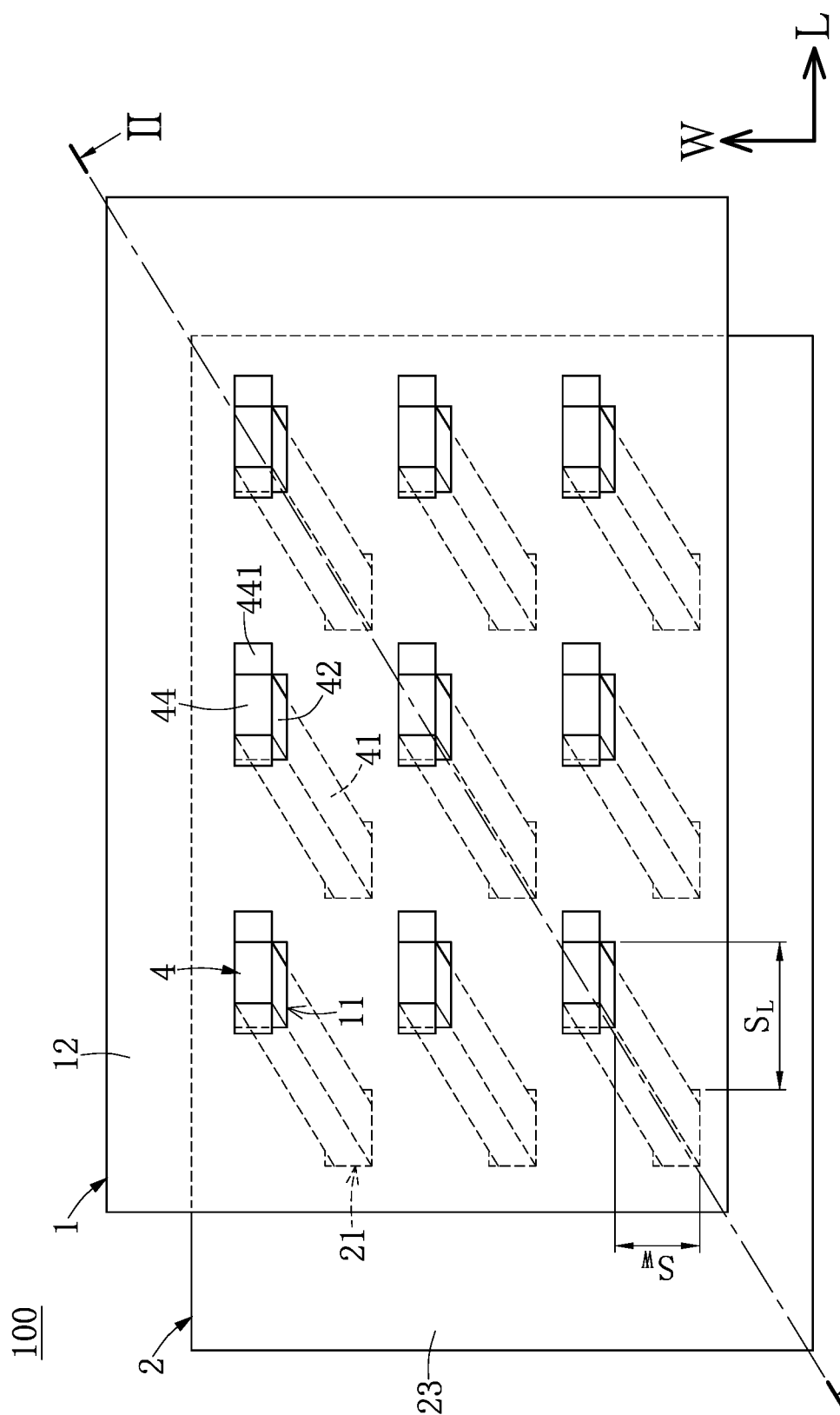
FIG. 1 is a top view showing a probe head according to the present disclosure.
Figure 2:
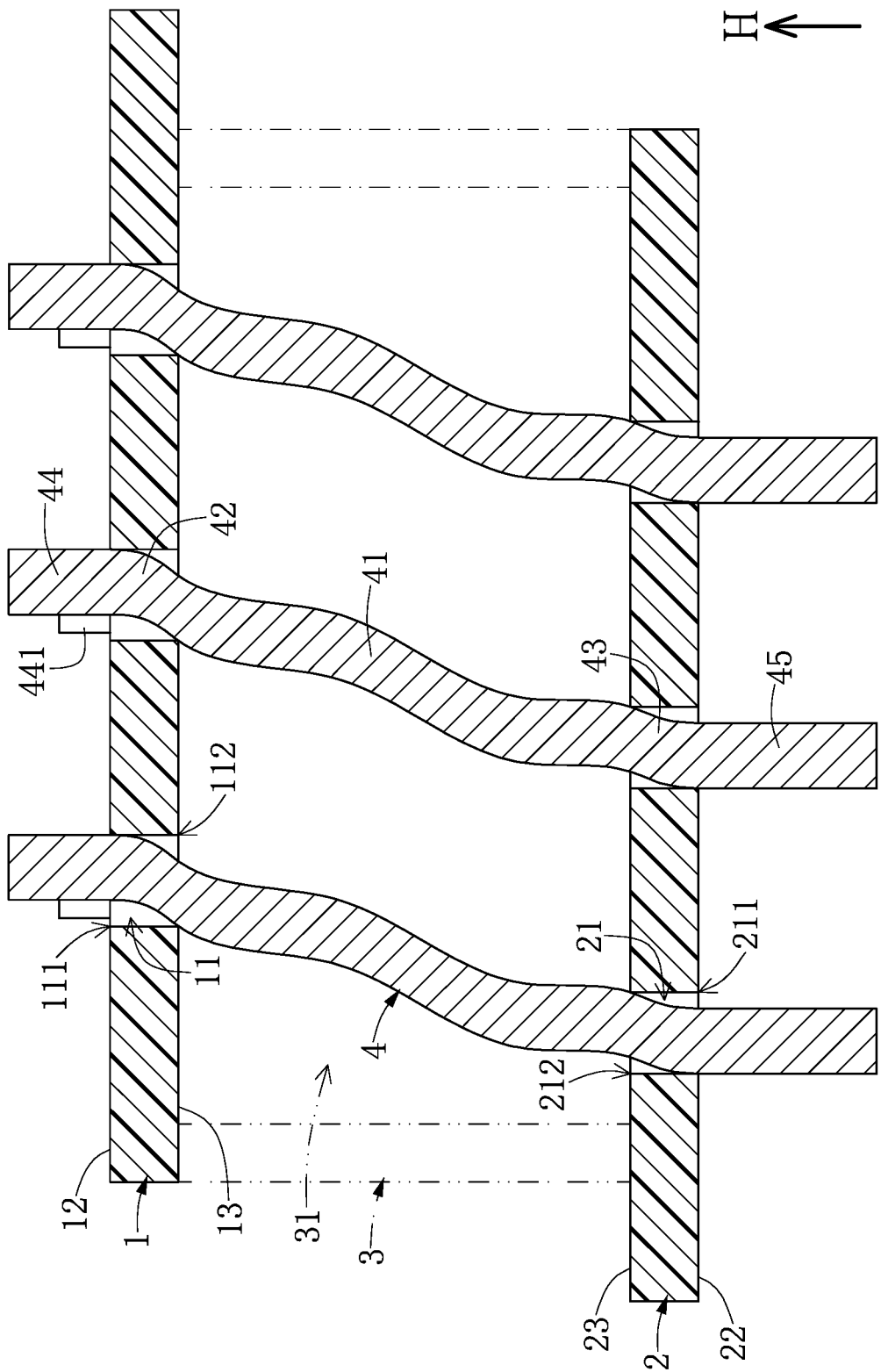
FIG. 2 is a cross sectional view taken along a cross sectional line II-II of FIG. 1.
Figure 3:
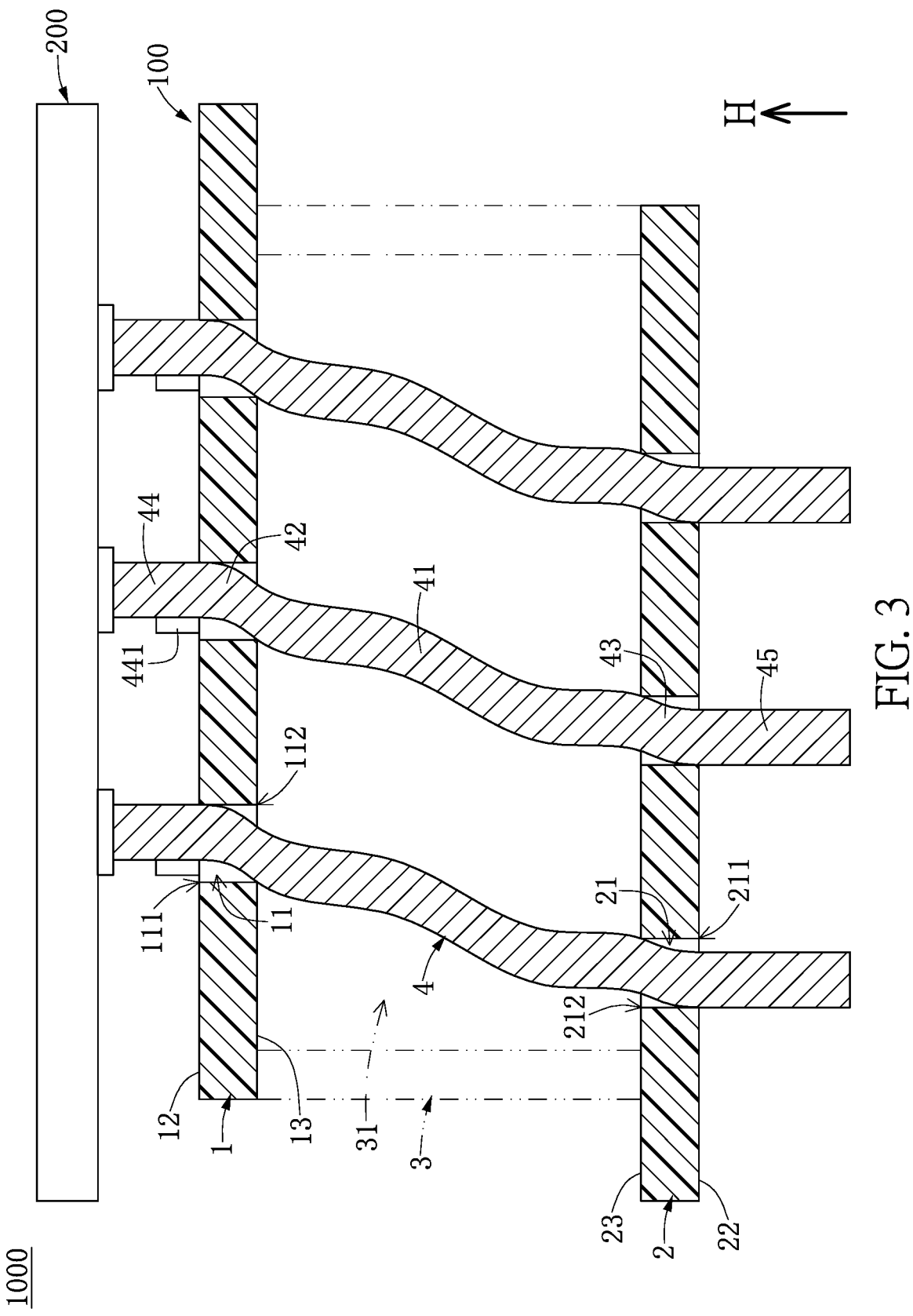
FIG. 3 is a cross sectional view showing a probe card device according to the present disclosure.

Reference is made to FIGS. 1 to 9, which illustrate an embodiment of the present disclosure. As shown in FIGS. 1 to 3, the present embodiment discloses a probe card device 1000 including a probe head 100 and a transfer plate 200. A side (e.g., the top side of the probe head 100 as shown in FIG. 3) of the probe head 100 is connected to the transfer plate 200, and another side (e.g., the bottom side of the probe head 100 as shown in FIG. 3) of the probe head 100 can be used to test an object to be tested, such as a semi-conductor wafer (not shown in the drawings). In this embodiment, the probe head 100 of the present embodiment cooperates with the transfer plate 200, but the present disclosure is not limited thereto.

In order to easily express the present embodiment, the drawings only show a part of the probe card device 1000 to clearly show the structure and connection of each component of the probe card device 1000. The following description discloses the structure and connection of each component of the probe card device 1000.

The probe head 100 in the present embodiment has a longitudinal direction L, a width direction W, and a height direction H, which are perpendicular to each other. As shown in FIG. 3, the probe head 100 includes a first die 1 (i.e., an upper die), a second die 2 (i.e., a lower die), a spacer 3 sandwiched between the first die 1 and the second die 2, and a plurality of rectangular probes 4. Moreover, the second die 2 is substantially parallel to the first die 1, and the second die 2 in the present embodiment is spaced apart from the first die 1 along the height direction H through the spacer 3, but the present disclosure is not limited thereto. For example, in other embodiments of the present disclosure, the second die 2 can be spaced apart from the first die 1 along the height direction H in other manners.

The first die 1 has a plurality of first rectangular walls 11 each defining a thru-hole. The second die 2 has a plurality of second rectangular walls 21 each defining a thru-hole. The second rectangular walls 21 respectively correspond in position to the first rectangular walls 11 one by one, and the thru-hole of each of the second rectangular walls 21 is smaller than that of each of the first rectangular walls 11.

Specifically, a long surface of each of the first rectangular walls 11 and a long surface of each of the second rectangular walls 21 are parallel to the longitudinal direction L as shown in FIG. 1. A short surface of each of the first rectangular walls 11 and a short surface of each of the second rectangular walls 21 are parallel to the width direction W as shown in FIG. 1. As shown in FIG. 2, each of the first rectangular walls 11 has a first outer hole edge 111 formed on an outer surface 12 of the first die 1 and a first inner hole edge 112 formed on an inner surface 13 of the first die 1. Each of the second rectangular walls 21 has a second outer hole edge 211 formed on an outer surface 22 of the second die 2 and a second inner hole edge 212 formed on an inner surface 23 of the second die 2.

As shown in FIGS. 1 and 2, the rectangular probes 4 are substantially in a matrix arrangement, an end of the rectangular probes 4 respectively pass through the first rectangular walls 11 of the first die 1, and another end of the rectangular probes 4 respectively pass through the second rectangular walls 21 of the second die 2. In other words, each of the rectangular probes 4 is sequentially disposed to passes through the corresponding first rectangular wall 11 of the first die 1, the spacer 3, and the corresponding second rectangular wall 21 of the second die 2. However, since the spacer 3 has lower correlation with the present embodiment, the structure thereof will not be described in detail in the following.

It should be noted that since the probe card device 1000 in the present embodiment is limited to producing the rectangular probe 4 by using MEMS technology, the present embodiment excludes any round probe produced by using a producing process different from the MEMS technology. In other words, since the producing process of the rectangular probe 4 is drastically different from that of any round probe, the round probe does not provide any motivation for the production of the rectangular probe 4.

Since the rectangular probes 4 in the present embodiment are of the same structure, the following description only discloses the structure of one of the rectangular probes 4 for the sake of brevity. However, in other embodiments of the present disclosure, the rectangular probes 4 of the probe card device 1000 can be formed with different structures.

As shown in FIGS. 1 and 2, each of the rectangular probes 4 has a deformable segment 41, a first positioned segment 42 and a second positioned segment 43 both respectively extending from two opposite ends (e.g., the top and bottom ends of the deformable segment 41 as shown in FIG. 2) of the deformable segment 41, a first contacting segment 44 extending from the first positioned segment 42 along a direction (e.g., an upward direction) away from the deformable segment 41, and a second contacting segment 45 extending from the second positioned segment 43 along a direction (e.g., a downward direction) away from the deformable segment 41.

Figure 9:
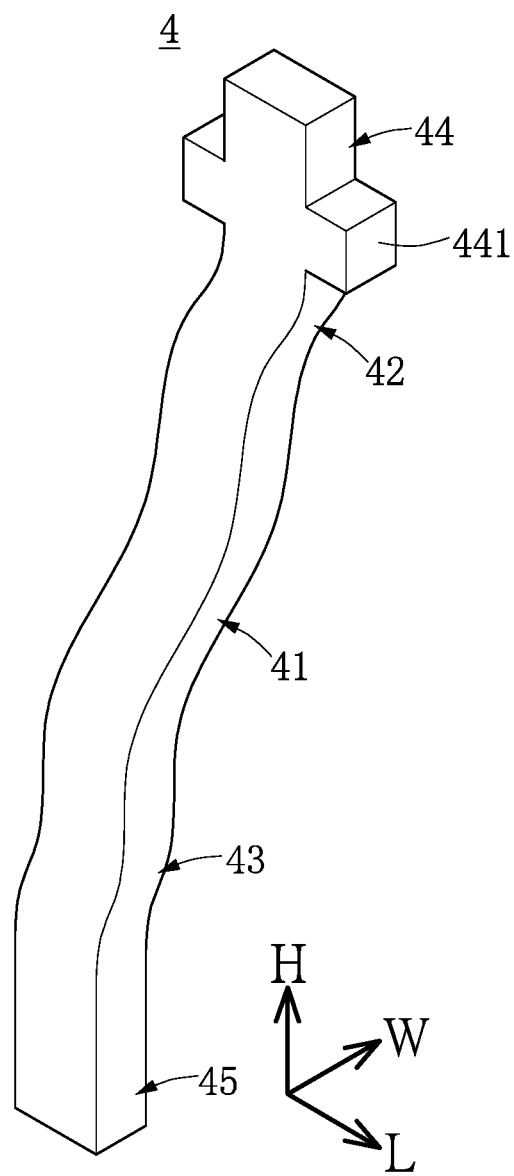
FIG. 9 is a perspective view showing the rectangular probe that is compressed by the first die and the second die.

Specifically, any portion of each of the deformable segments 41 has the same cross sectional area. In other words, the deformable segment 41 in the present embodiment is formed without any protrusion or slot on an outer surface thereof, and the probe card device 1000 in the present embodiment excludes a probe having a protrusion or slot on a deformable segment thereof. Moreover, the first contacting segment 44 includes a limiting portion 441 arranged adjacent to the first positioned segment 42, and the limiting portion 441 abuts against the outer surface 12 of the first die 1 as shown in FIG. 1. The first contacting segment 44 and the first positioned segment 42 in the present embodiment are jointly formed as a cross-shaped structure as shown in FIG. 9, but the present disclosure is not limited thereto. An end structure of the second contacting segment 45 can be formed according to design requirements, such as a flat structure, a tapered structure, or a concave structure.

As shown in FIGS. 1 and 2, the deformable segments 41 of the probe head 100 are substantially arranged between the first die 1 and the second die 2. In the present embodiment, the deformable segments 41 are arranged in an accommodating hole 31 of the spacer 3, and are spaced apart from each other. The first positioned segments 42 are respectively disposed in the first rectangular walls 11 of the first die 1, and the second positioned segments 43 are respectively disposed in the second rectangular walls 21 of the second die 2. The first contacting segments 44 are respectively arranged outside the first rectangular walls 11, and are abutted against and fixed to the transfer plate 200. The second contacting segments 45 are respectively arranged outside the second rectangular walls 21, and are configured to elastically and detachably abut against an object to be tested.

Figure 8:
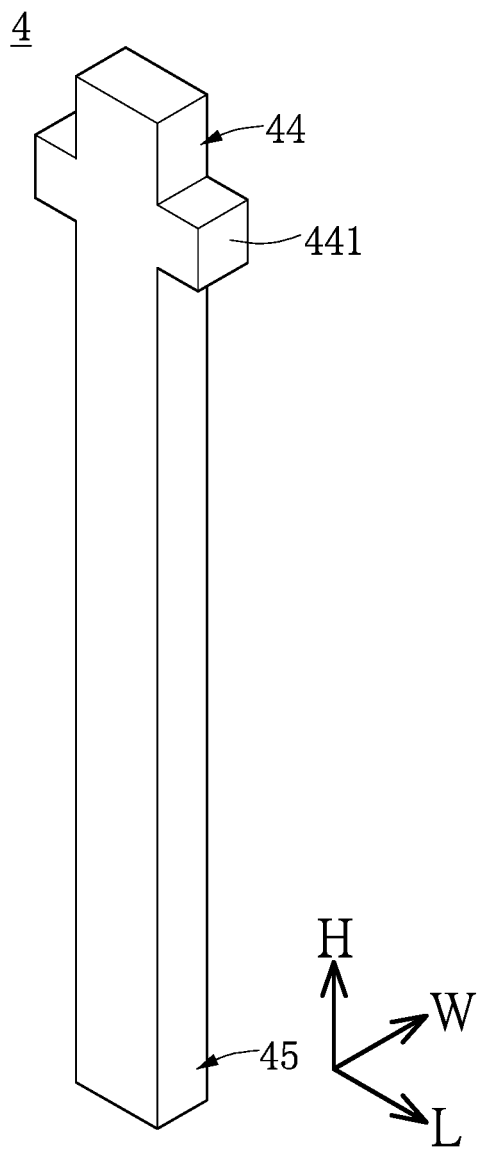
FIG. 8 is a perspective view showing the rectangular probe that is not compressed by the first die and the second die.

Specifically, the first rectangular walls 11 of the first die 1 are respectively staggered with respect to the second rectangular walls 21 of the second die 2. Each of the first rectangular walls 11 and the corresponding second rectangular wall 21 have a longitudinal offset $S_L$ in the longitudinal direction L and a width offset $S_W$ in the width direction W (i.e., the first die 1 produces the longitudinal offset $S_L$ and the width offset $S_W$ with respect to the second die 2) so as to press the first positioned segment 42 and the second positioned segment 43 of the corresponding rectangular probe 4, so that the deformable segment 41 of the corresponding rectangular probe 4 is compressed to be in a curved and deformed shape. Moreover, the rectangular probe 4 as shown in FIG. 8 is not compressed by the rectangular wall 11 and the second rectangular wall 21, and the rectangular probe 4 as shown in FIG. 9 is compressed by the rectangular wall 11 and the second rectangular wall 21.

Furthermore, a ratio of the longitudinal offset $S_L$ to the width offset $S_W$ is within a range of 10 to 1, and the ratio is preferably within a range of 3 to 1. In the present embodiment, the longitudinal offset $S_L$ is within a range of 30 µm to 1500 µm and the width offset $S_W$ is within a range of 5 µm to 1500 µm, but the present disclosure is not limited thereto.

Figure 4:
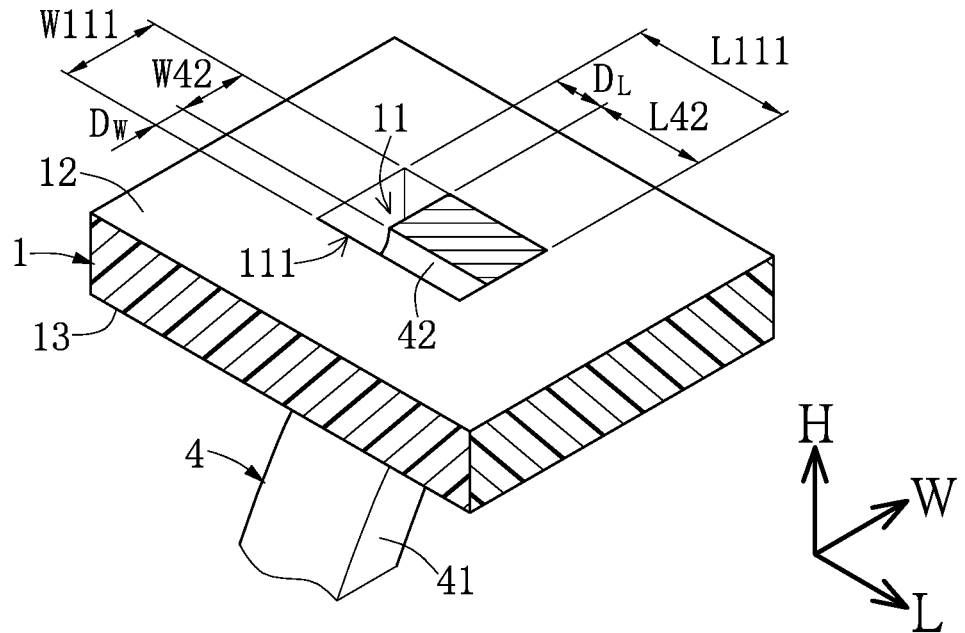
FIG. 4 is a first cross sectional view showing a rectangular probe and a corresponding portion of a first die according to the present disclosure.

As shown in FIGS. 1, 2, and 4, in a first cross section of each of the first positioned segments 42 and the first outer hole edge 111 of the corresponding first rectangular wall 11, the first positioned segment 42 has a rectangular shape including a first length L42 and a first width W42, the first length L42 is less than a length L111 of the first outer hole edge 111, a difference value in length $D_L$ between the first length L42 and the length L111 of the first outer hole edge 111 is preferably less than the longitudinal offset $S_L$, the first width W42 is less than a width W111 of the first outer hole edge 111, and a difference value in width $D_W$ between the first width W42 and the width W111 of the first outer hole edge 111 is preferably less than the width offset $S_W$.

Specifically, as shown in FIGS. 1 and 4, in a process that the first die 1 generates the longitudinal offset $S_L$ with respect to the second die 2, after the first positioned segment 42 is pressed by the first rectangular wall 11 presses to be moved a distance of the difference value in length $D_L$, the first rectangular wall 11 presses the first positioned segment 42 along the longitudinal direction L, and a difference value between the longitudinal offset $S_L$ and the difference value in length $D_L$ is substantially equal to the distance that the first positioned segment 42 is pressed by the first rectangular wall 11. In the present embodiment, the difference value in length $D_L$ is preferably within a range of 5 µm to 35 µm, but the present disclosure is not limited thereto.

Moreover, as shown in FIGS. 1 and 4, in a process that the first die 1 generates the width offset $S_W$ with respect to the second die 2, after the first positioned segment 42 is pressed by the first rectangular wall 11 to be moved in a distance of the difference value in width $D_W$, the first rectangular wall 11 presses the first positioned segment 42 along the width direction W, and a difference value between the width offset $S_W$ and the difference value in width $D_W$ is substantially equal to the distance that the first positioned segment 42 is pressed by the first rectangular wall 11. In the present embodiment, the difference value in width $D_W$ is preferably within a range of 5 µm to 35 µm, but the present disclosure is not limited thereto.

Figure 7:
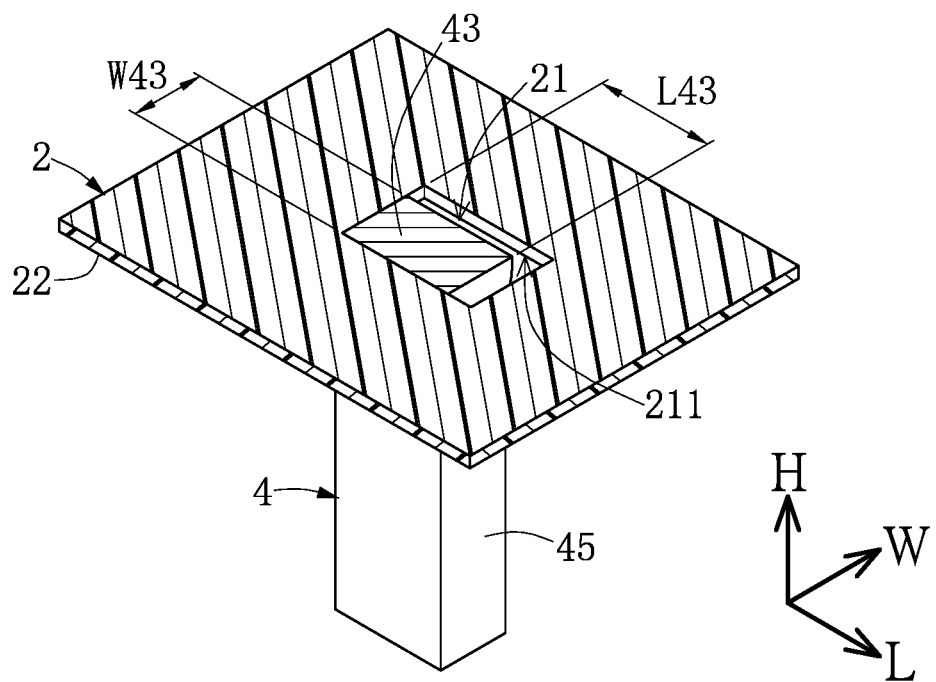
FIG. 7 is a second cross sectional view showing the rectangular probe and the corresponding portion of the second die according to the present disclosure.

As shown in FIG. 7, in a second cross section of each of the second positioned segments 43 and the second outer hole edge 211 of the corresponding second rectangular wall 21, the second positioned segment 43 has a rectangular shape including a second length L43 and a second width W43, the second length L43 is equal to the first length L42, and the second width W43 is equal to the first width W42, but the present disclosure is not limited thereto.

In addition, in other embodiments of the present disclosure, the first length L42 can be substantially equal to the length L111 of the first outer hole edge 111, and the first width W42 can be substantially equal to the width W111 of the first outer hole edge 111, so the distance that the first positioned segment 42 is pressed by the first rectangular wall 11 along the longitudinal direction L is substantially equal to the longitudinal offset $S_L$, and the distance that the first positioned segment 42 is pressed by the first rectangular wall 11 along the width direction W is substantially equal to the width offset $S_W$.

Accordingly, by adjusting the longitudinal offset $S_L$ and the width offset $S_W$, the probe head 100 of the present embodiment enables the deformable segment 41 of each of the rectangular probes 4 to be in a proper deformed range to prevent fracture, such that the reliability and service life of the probe head 100 (or the probe card device 1000) can be effectively improved. Moreover, when the second contacting segments 45 of the probe head 100 (or the probe card device 1000) are used to contact an object by a pressure, the deformable segment 41 subjected to the pressure can avoid fracture by adjusting the longitudinal offset $S_L$ and the width offset $S_W$.

Figure 5:
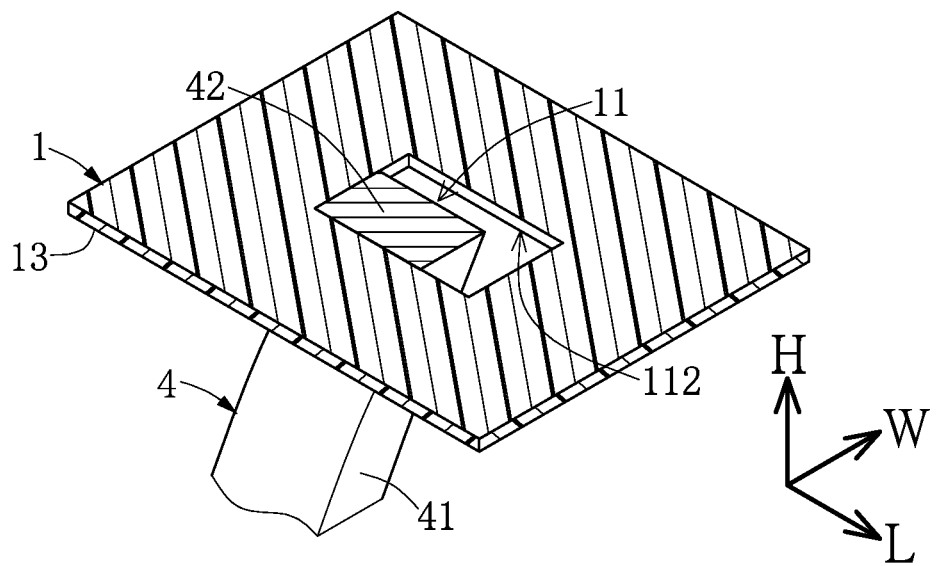
FIG. 5 is a second cross sectional view showing the rectangular probe and the corresponding portion of the first die according to the present disclosure.
Figure 6:
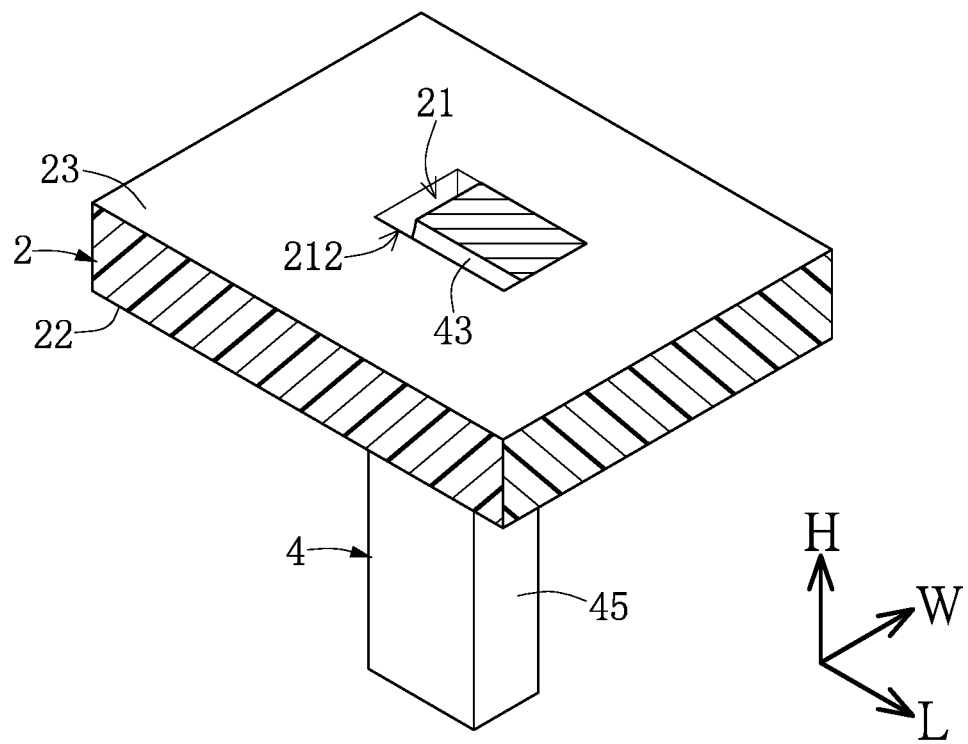
FIG. 6 is a first cross sectional view showing the rectangular probe and a corresponding portion of a second die according to the present disclosure.

In other words, as shown in FIGS. 2, 4, and 5, in each of the rectangular probes 4 and the corresponding first rectangular wall 11, the first positioned segment 42 abuts against two corners (e.g., the upper-right corner of FIG. 4 and the lower-left corner of FIG. 5) that are respectively arranged on the first outer hole edge 111 and the first inner hole edge 112 and are diagonally opposite to each other. As shown in FIGS. 2, 6, and 7, in each of the rectangular probes 4 and the corresponding second rectangular wall 21, the second positioned segment 43 abuts against two corners (e.g., the lower-left corner of FIG. 7 and the upper-right corner of FIG. 6) that are respectively arranged on the second outer hole edge 211 and the second inner hole edge 212 and are diagonally opposite to each other. Furthermore, in each of the rectangular probes 4, the corner (e.g., the lower-left corner of FIG. 5) of the first inner hole edge 112 abutted against the first positioned segment 42 is arranged adjacent to the corner (e.g., the upper-right corner of FIG. 6) of the second inner hole edge 212 abutted against the second positioned segment 43.

Accordingly, the first positioned segment 42 of the rectangular probe 4 of the present embodiment can be supported by the first rectangular wall 11 of the first die 1, and the second positioned segment 43 can be supported by the second rectangular wall 21 of the second die 2, so that the two opposite ends of the deformable segment 41 of the rectangular probe 4 can be effectively supported.

Technical Effects of the Present Embodiments

In summary, by adjusting the longitudinal offset $S_L$ and the width offset $S_W$, the probe head 100 (or the probe card device 1000) of the present disclosure enables the deformable segment 41 of each of the rectangular probes 4 to be in a proper deformed range to prevent fracture, such that the reliability and service life of the probe head 100 (or the probe card device 1000) can be effectively improved. Moreover, when the second contacting segments 45 of the probe head 100 (or the probe card device 1000) are used to contact an object by a pressure, the deformable segment 41 subjected to the pressure can avoid fracture by adjusting the longitudinal offset $S_L$ and the width offset $S_W$.

Moreover, for the probe card device 1000 and the probe head 100 of the present disclosure, the first positioned segment 42 of the rectangular probe 4 can be supported by the first rectangular wall 11 of the first die 1, and the second positioned segment 43 of the rectangular probe 4 can be supported by the second rectangular wall 21 of the second die 2, so that the two opposite ends of the deformable segment 41 of the rectangular probe 4 can be effectively supported.

The descriptions illustrated supra set forth simply the exemplary embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:
1. A probe card device, comprising:
 a probe head defining a longitudinal direction, a width direction, and a height direction, wherein the longitudinal direction, the width direction, and the height direction are perpendicular to each other, and the probe head includes:
  a first die having a plurality of first rectangular walls each defining a thru-hole, wherein a long surface of each of the first rectangular walls is parallel to the longitudinal direction, and a short surface of each of the first rectangular walls is parallel to the width direction;
  a second die spaced apart from the first die along the height direction and having a plurality of second rectangular walls each defining a thru-hole, wherein the second rectangular walls are arranged to respectively correspond in position to the first rectangular walls; and
  a plurality of rectangular probes each having a deformable segment, a first positioned segment and a second positioned segment both respectively extending from two opposite ends of the deformable segment, a first contacting segment extending from the first positioned segment along a direction away from the deformable segment, and a second contacting segment extending from the second positioned segment along a direction away from the deformable segment,
  wherein any portion of each of the deformable segments has the same cross sectional area, the deformable segments are substantially arranged between the first die and the second die, the first positioned segments are respectively disposed in the first rectangular walls of the first die, the second positioned segments are respectively disposed in the second rectangular walls of the second die, the first contacting segments are respectively arranged outside the first rectangular walls, and the second contacting segments are respectively arranged outside the second rectangular walls,
  wherein each of the first rectangular walls and the corresponding second rectangular wall have a longitudinal offset in the longitudinal direction and a width offset in the width direction so as to press the first positioned segment and the second positioned segment of the corresponding rectangular probe, so that the deformable segment of the corresponding rectangular probe is compressed to be in a curved and deformed shape, and wherein a ratio of the longitudinal offset to the width offset is in a range from 10 to 1; and
 a transfer plate abutted against and fixed to the first contacting segments of the rectangular probes, wherein the second contacting segments of the rectangular probes are configured to elastically and detachably abut against an object to be tested,
 wherein each of the first rectangular walls has a first outer hole edge formed on an outer surface of the first die and a first inner hole edge formed on an inner surface of the first die; in a first cross section in each of the first positioned segments and the corresponding first outer hole edge, the first positioned segment is in a rectangular shape and includes a first length and a first width, the first length being less than a length of the first outer hole edge, a difference value in length between the first length and the length of the first outer hole edge being less than the longitudinal offset, the first width being less than a width of the first outer hole edge, and a difference value in width between the first width and the width of the first outer hole edge being less than the width offset, wherein in each of the rectangular probes and the corresponding first rectangular wall, the first positioned segment abuts against two corners respectively on the first outer hole edge and the first inner hole edge that are diagonally opposite to each other, wherein each of the second rectangular walls has a second outer hole edge formed on an outer surface of the second die and a second inner hole edge formed on an inner surface of the second die; in a second cross section of each of the second positioned segments and the corresponding second outer hole edge, the second positioned segment has a rectangular shape and includes a second length and a second width, the second length being equal to the first length, and the second width being equal to the first width; in each of the second positioned segments and the corresponding second rectangular wall, the second positioned segment abuts against two corners respectively on the second outer hole edge and the second inner hole edge that are diagonally opposite to each other; in each of the rectangular probes, the corner of the first inner hole edge abutted by the first positioned segment is adjacent to the corner of the second inner hole edge abutted by the second positioned segment.

2. The probe card device as claimed in claim 1, wherein the difference value in length is in a range from 5 μm to 35 μm, and the difference value in width is in a range from 5 μm to 35 μm.

3. The probe card device as claimed in claim 1, further comprising a spacer sandwiched between the first die and the second die, wherein the spacer has an accommodating hole, and the deformable segments spaced apart from each other are arranged in the accommodating hole of the spacer.

4. The probe card device as claimed in claim 1, wherein in each of the rectangular probes, the first contacting segment includes a limiting portion adjacent to the first positioned segment, and the limiting portion abuts against an outer surface of the first die.

5. The probe card device as claimed in claim 1, wherein the ratio of the longitudinal offset to the width offset is further limited to be in a range from 3 to 1.

6. A probe head defining a longitudinal direction, a width direction, and a height direction, which are perpendicular to each other, comprising:
- a first die having a plurality of first rectangular walls each defining a thru-hole, wherein a long surface of each of the first rectangular walls is parallel to the longitudinal direction, and a short surface of each of the first rectangular walls is parallel to the width direction;
- a second die spaced apart from the first die along the height direction and having a plurality of second rectangular walls each defining a thru-hole, wherein the second rectangular walls respectively correspond in position to the first rectangular walls; and
- a plurality of rectangular probes each having a deformable segment, a first positioned segment, and a second positioned segment respectively extending from two opposite ends of the deformable segment, any portion of each of the deformable segments has the same cross sectional area, the deformable segments are substantially arranged between the first die and the second die, the first positioned segments are respectively disposed in the first rectangular walls of the first die, and the second positioned segments are respectively disposed in the second rectangular walls of the second die, wherein each of the first rectangular walls and the corresponding second rectangular wall have a longitudinal offset in the longitudinal direction and a width offset in the width direction so as to press the first positioned segment and the second positioned segment of the corresponding rectangular probe, so that the deformable segment of the corresponding rectangular probe is compressed to be in a curved and deformed shape, and wherein a ratio of the longitudinal offset to the width offset is in a range from 10 to 1, wherein each of the first rectangular walls has a first outer hole edge formed on an outer surface of the first die and a first inner hole edge formed on an inner surface of the first die; in a first cross section in each of the first positioned segments and the corresponding first outer hole edge, the first positioned segment is in a rectangular shape and includes a first length and a first width, the first length being less than a length of the first outer hole edge, a difference value in length between the first length and the length of the first outer hole edge being less than the longitudinal offset, the first width being less than a width of the first outer hole edge, and a difference value in width between the first width and the width of the first outer hole edge being less than the width offset, wherein in each of the rectangular probes and the corresponding first rectangular wall, the first positioned segment abuts against two corners respectively on the first outer hole edge and the first inner hole edge that are diagonally opposite to each other, wherein each of the second rectangular walls has a second outer hole edge formed on an outer surface of the second die and a second inner hole edge formed on an inner surface of the second die; in a second cross section of each of the second positioned segments and the corresponding second outer hole edge, the second positioned segment has a rectangular shape and includes a second length and a second width, the second length being equal to the first length, and the second width being equal to the first width; in each of the second positioned segments and the corresponding second rectangular wall, the second positioned segment abuts against two corners respectively on the second outer hole edge and the second inner hole edge that are diagonally opposite to each other; in each of the rectangular probes, the corner of the first inner hole edge abutted by the first positioned segment is adjacent to the corner of the second inner hole edge abutted by the second positioned segment.

* * * * *